(12) United States Patent
Mizutani et al.

(10) Patent No.: US 12,219,704 B2
(45) Date of Patent: Feb. 4, 2025

(54) WIRING SUBSTRATE

(71) Applicant: IBIDEN CO., LTD., Gifu (JP)

(72) Inventors: Naoki Mizutani, Ogaki (JP); Akifumi Shikano, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 247 days.

(21) Appl. No.: 18/061,555

(22) Filed: Dec. 5, 2022

(65) Prior Publication Data

US 2023/0180386 A1 Jun. 8, 2023

(30) Foreign Application Priority Data

Dec. 6, 2021 (JP) ................................ 2021-198075

(51) Int. Cl.
*H05K 1/11* (2006.01)

(52) U.S. Cl.
CPC ..... *H05K 1/113* (2013.01); *H05K 2201/0266* (2013.01); *H05K 2201/09563* (2013.01)

(58) Field of Classification Search
CPC ........... H05K 1/113; H05K 2201/0266; H05K 2201/09563
USPC ....................................................... 174/255
See application file for complete search history.

(56) References Cited

U.S. PATENT DOCUMENTS

2020/0253062 A1* 8/2020 Zhang .................... H05K 1/186

FOREIGN PATENT DOCUMENTS

JP 2015-097252 A 5/2015

* cited by examiner

*Primary Examiner* — Tremesha W Burns
(74) *Attorney, Agent, or Firm* — Oblon, McClelland, Maier & Neustadt, L.L.P.

(57) ABSTRACT

A wiring substrate includes a first conductor pattern, a second conductor pattern, an insulating layer interposed between the first and second patterns and having a through hole, and a plating conductor integrally formed with the second pattern and filling the through hole in the insulating layer such that the plating conductor is in contact with the first pattern. The through hole has an expansion part such that an opening width of the through hole on the first pattern side is widened, and the plating conductor includes a first plating film directly formed on inner wall of the through hole and a second plating film formed on the first plating film such that the minimum thickness of the first plating film in the expansion part is in the range of 55% to 95% of the minimum thickness of the first plating film in the through hole other than the expansion part.

20 Claims, 7 Drawing Sheets

WIRING SUBSTRATE

CROSS-REFERENCE TO RELATED APPLICATIONS

The present application is based upon and claims the benefit of priority to Japanese Patent Application No. 2021-198075, filed Dec. 6, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-97252 describes a multilayer wiring substrate having an interlayer connection between an inner-layer wiring and an upper-layer wiring. The entire contents of this publication are incorporated herein by reference.

SUMMARY OF THE INVENTION

According to one aspect of the present invention, a wiring substrate includes a first conductor pattern, a second conductor pattern facing the first conductor pattern, an insulating layer interposed between the first conductor pattern and the second conductor pattern and having a through hole, and a plating conductor integrally formed with the second conductor pattern and filling the through hole formed in the insulating layer such that the plating conductor is in contact with the first conductor pattern. The through hole has an expansion part such that an opening width of the through hole on a first conductor pattern side is widened, and the plating conductor includes a first plating film directly formed on an inner wall of the through hole and a second plating film formed on the first plating film such that the minimum thickness of the first plating film in the expansion part is in a range of 55% to 95% of a minimum thickness of the first plating film in the through hole other than the expansion part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
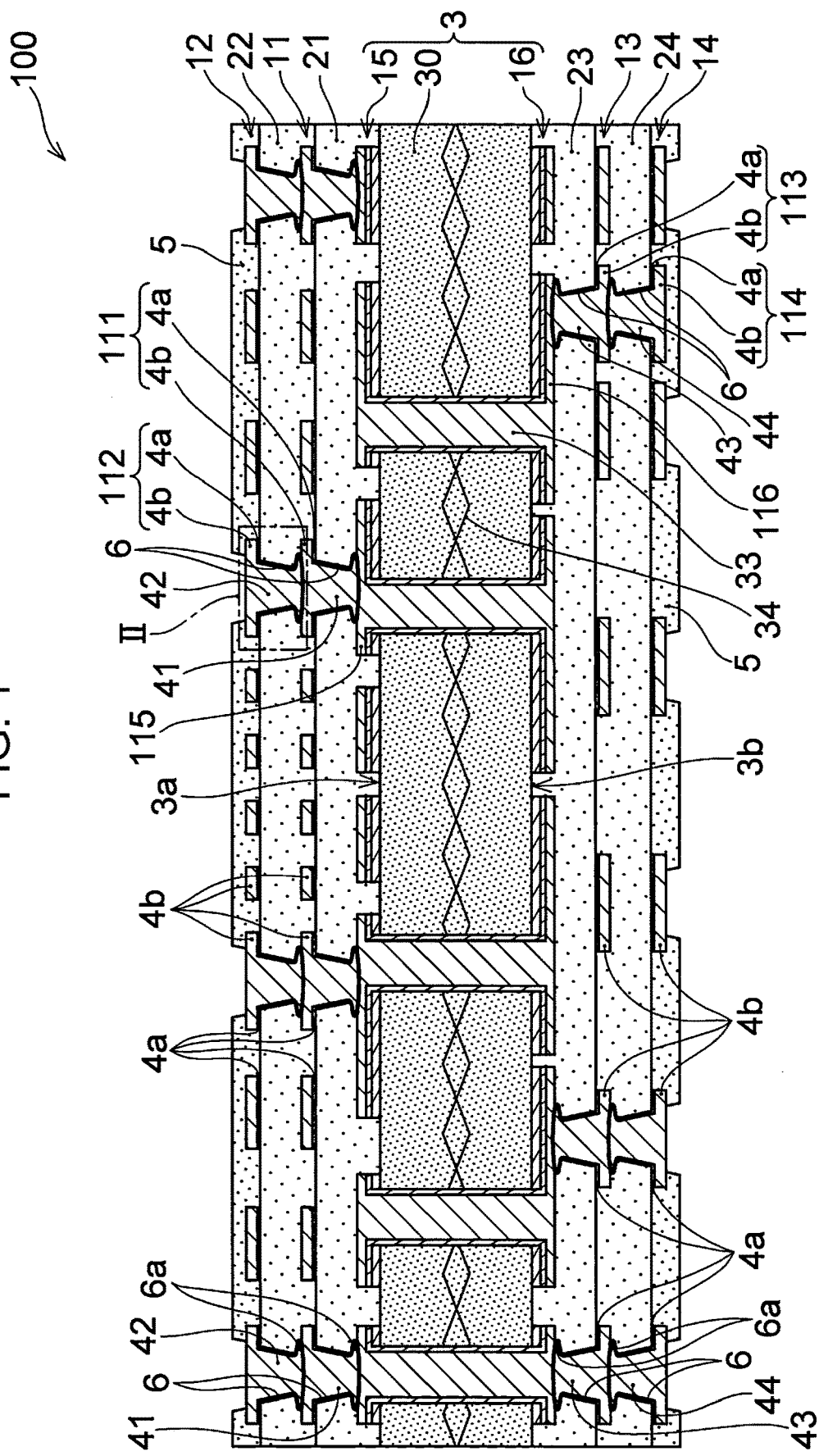
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
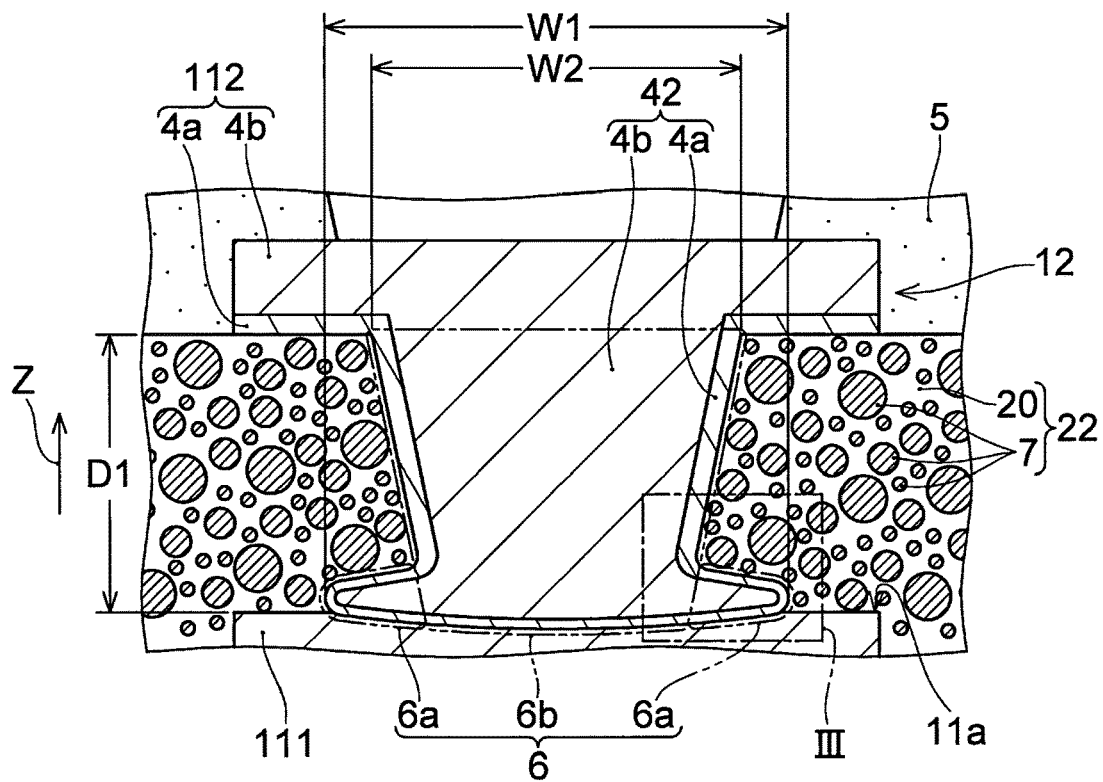
FIG. 2 is an enlarged view of a portion (II) of FIG. 1.
Figure 3:
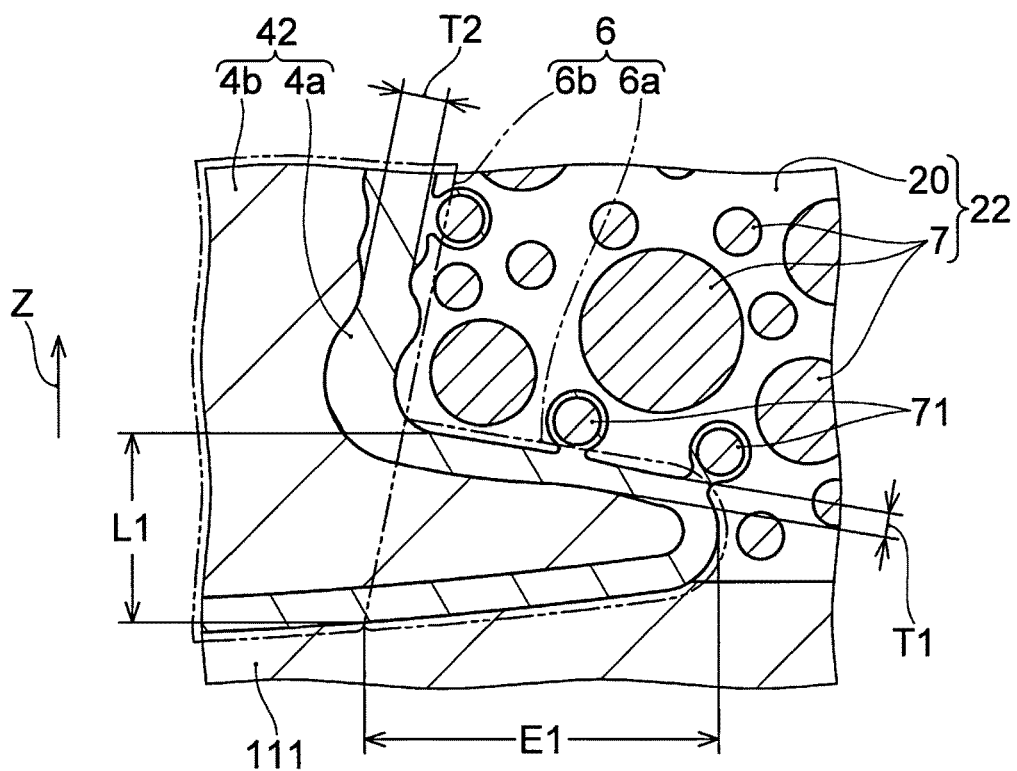
FIG. 3 is an enlarged view schematically illustrating a portion (III) of FIG. 2.

A wiring substrate according to an embodiment of the present invention is described with reference to the drawings. FIG. 1 is a cross-sectional view illustrating a wiring substrate 100, which is an example of the wiring substrate of the embodiment. FIG. 2 is an enlarged view of a portion (II) of FIG. 1. FIG. 3 illustrates a further enlarged view of a portion (III) of FIG. 2. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and conductor layers and insulating layers laminated on both sides of the core substrate 3. On a first surface (3a) of the core substrate 3, an insulating layer 21, a conductor layer 11, an insulating layer 22, and a conductor layer 12 are laminated in this order. On a second surface (3b) of the core substrate 3, an insulating layer 23, a conductor layer 13, an insulating layer 24, and a conductor layer 14 are laminated in this order. The core substrate 3 includes an insulating layer 30, and a conductor layer 15 and a conductor layer 16, which are respectively formed on a surface of the insulating layer 30 on the first surface (3a) side and a surface of the insulating layer 30 on the second surface (3b) side. Through-hole conductors 33 connecting the conductor layer 15 and the conductor layer 16 are formed in the insulating layer 30. In this way, the wiring substrate of the embodiment includes at least one set of two conductor layers facing each other and at least one insulating layer interposed between two conductor layers facing each other. The wiring substrate 100 of the FIG. 1 includes the conductor layers (11-16), the insulating layer 30, and the insulating layers (21-24).

In the description of the embodiment, a side farther from the insulating layer 30 in a thickness direction of the wiring substrate 100 is also referred to as an "outer side," an "upper side," or simply "upper," and a side closer to the insulating layer 30 is also referred to as an "inner side," a "lower side," or simply "lower." Further, for the conductor layers, conductor patterns included in the conductor layers, and the insulating layers, a surface facing the opposite side with respect to the insulating layer 30 is also referred to as an "upper surface," and a surface facing the insulating layer 30 side is also referred to as a "lower surface."

A solder resist 5 is formed on the conductor layer 12 and the insulating layer 22. A solder resist 5 is also formed on the conductor layer 14 and the insulating layer 24. Each of the solder resists 5 is provided with openings that each expose a part of the conductor layer 12 or a part of the conductor layer 14. Each of the solder resists 5 is formed of, for example, a photosensitive epoxy resin or polyimide resin, or the like.

Plating conductors (41-44) penetrating the insulating layers (21-24) are formed in the insulating layers (21-24). The insulating layers (21-24) have through holes 6 penetrating the insulating layers, and the plating conductors are formed in the through holes 6 penetrating the insulating layers. The through holes 6 penetrating the insulating layer 21 are filled with the plating conductors 41, the through-holes 6 penetrating the insulating layer 22 are filled with the plating conductors 42, the through holes 6 penetrating the insulating layer 23 are filled with the plating conductors 43, and the through holes 6 penetrating the insulating layer 24 are filled with the plating conductors 44.

Each of the plating conductors (41-44) protrudes from one of two conductor layers facing each other to be in contact with the other. The plating conductors 41 are integrally formed with the conductor layer 11 and connect the conductor layer 11 and the conductor layer 15. The plating conductors 42 are integrally formed with the conductor layer 12 and connect the conductor layer 12 and the conductor layer 11. The plating conductors 43 are integrally formed with the conductor layer 13 and connect the conductor layer 13 and the conductor layer 16. The plating conductors 44 are integrally formed with the conductor layer 14 and connect the conductor layer 14 and the conductor layer 13.

In this way, each of the plating conductors (41-44) is a so-called via conductor that connects two conductor layers facing each other via an insulating layer. Since at least one of the two conductor layers connected by each of the plating conductors (41-44) is an inner-layer conductor layer, the plating conductors (41-44) are all interstitial via holes (IVH). The plating conductors (42, 44) connecting an outer-layer conductor layer (the conductor layer 12 or the conductor layer 14) and an inner-layer conductor layer (the conductor layer 11 or the conductor layer 13) are so-called blind via holes (BVH), and the plating conductors (41, 43) connecting inner-layer conductor layers (the conductor layers (15, 16, 11, 13)) are so-called buried via holes.

The insulating layer 30 and the insulating layers (21-24) are formed of any insulating resin. An example of the insulating resin is a thermosetting resin such as an epoxy resin, a bismaleimide triazine resin (BT resin), or a phenol resin. In the example of FIG. 1, the insulating layer 30 contains a core material (reinforcing material) 34 formed of a glass fiber, an aramid fiber, or the like. Each of the insulating layers may further contain an insulating resin 20 (see FIG. 3), such as an epoxy resin, and multiple filler particles 7 (see FIG. 3) added to the insulating resin 20. The filler particles 7 may be have a form of granules or powder. By adding the filler particles 7, properties of each of the insulating layers, such as thermal properties or mechanical properties, are adjusted. Examples of the filler particles 7 include inorganic filler particles formed of particles of an inorganic substance such as silicon dioxide (silica, SiO2), alumina, or mullite. The filler particles 7 may be organic filler particles formed of particles of an organic substance such as silicone or polyimide.

The conductor layers (11-16), the through-hole conductors 33, and the plating conductors (41-44) may be formed using any metal such as copper or nickel. Each of the conductor layers (11-14) and the plating conductors (41-44) has a two-layer structure in the example of FIG. 1. Each of the conductor layers (11-14) and the plating conductors (41-44) in FIG. 1 includes a first plating film (4a) and a second plating film (4b) formed on the first plating film (4a). The first plating film (4a) of the plating conductors (41-44) is directly formed on inner walls of the through holes 6. The first plating film (4a) is formed, for example, by wet plating such as electroless plating. The first plating film (4a) is also a power feeding layer when the second plating film (4b) is formed. That is, the second plating film (4b) is an electrolytic plated film formed by electrolytic plating using the first plating film (4a) as a power feeding layer. Each of the through-hole conductors 33 also has a two-layer structure including an electroless plated film and an electrolytic plated film. On the other hand, each of the conductor layer 15 and the conductor layer 16 has a three-layer structure that further includes a metal foil.

Each of the conductor layers (11-16) includes any conductor patterns. For example, the conductor layer 11 includes conductor patterns 111, the conductor layer 12 includes conductor patterns 112, and the conductor layer 13 and the conductor layer 14 respectively include conductor patterns 113 and conductor patterns 114. Further, the conductor layer 15 includes conductor patterns 115, and the conductor layer 16 includes conductor patterns 116. The conductor patterns (111, 112, 113, 114) are respectively so-called via lands (via pads) of the plating conductors (41, 42, 43, 44), which are via conductors. Further, the conductor patterns (115, 111, 116, 113) are respectively so-called receiving pads of the plating conductors (41, 42, 43, 44), which are via conductors.

The plating conductors 41 are integrally formed with the conductor patterns 111, and protrude from the conductor patterns 111 to be in contact with the conductor patterns 115. The plating conductors 42 are integrally formed with the conductor patterns 112, and protrude from the conductor patterns 112 to be in contact with the conductor patterns 111. The plating conductors 43 are integrally formed with the conductor patterns 113, and protrude from the conductor patterns 113 to be in contact with the conductor patterns 116. The plating conductors 44 are integrally formed with the conductor patterns 114, and protrude from the conductor patterns 114 to be in contact with the conductor patterns 113.

The conductor patterns 115 and the conductor patterns 111 at least partially face each other with the insulating layer 21 interposed therebetween. The conductor patterns 111 and the conductor patterns 112 at least partially face each other with the insulating layer 22 interposed therebetween. The conductor patterns 116 and the conductor patterns 113 at least partially face each other with the insulating layer 23 interposed therebetween. The conductor patterns 113 and the conductor patterns 114 at least partially face each other with the insulating layer 24 interposed therebetween. That is, the insulating layer 21 is interposed between the conductor patterns 115 and the conductor patterns 111. The insulating layer 22 is interposed between the conductor patterns 111 and the conductor patterns 112. The insulating layer 23 is interposed between the conductor patterns 116 and the conductor patterns 113. The insulating layer 24 is interposed between the conductor patterns 113 and the conductor patterns 114.

Among two conductor patterns connected by one of the plating conductors (41-44), a conductor pattern, from a surface of which the one of the plating conductors (41-44) protrudes downward, is also referred to as a second conductor pattern. And, a conductor pattern that is in contact with a plating conductor protruding from a second conductor pattern and faces the second conductor pattern is also referred to as a first conductor pattern. For example, the conductor patterns 115 are the first conductor patterns with respect to the plating conductors 41 and the conductor patterns 111, and the conductor patterns 111 are the second conductor patterns with respect to the plating conductors 41 and the conductor patterns 115. On the other hand, the conductor patterns 111 are the first conductor patterns with respect to the plating conductors 42 and the conductor patterns 112, and the conductor patterns 112 are the second conductor patterns with respect to the plating conductors 42 and the conductor patterns 111.

Similarly, the conductor patterns 116 and the conductor patterns 113 are respectively the first conductor patterns with respect to the conductor patterns 113 and the conductor patterns 114, and are respectively the first conductor patterns with respect to the plating conductors 43 and the plating conductors 44. On the other hand, the conductor patterns 113 and the conductor patterns 114 are respectively the second conductor patterns with respect to the conductor patterns 116 and the conductor patterns 113, and are respectively the second conductor patterns with respect to the plating conductors 43 and the plating conductors 44.

As illustrated in FIG. 2, in the present embodiment, the through hole 6 has an expansion part (6a) that widens an opening width of the through hole 6 on a side of the first conductor pattern (the conductor pattern 111 in FIG. 2) among the two conductor patterns facing each other across the through hole 6. The through hole 6 includes the expansion part (6a), and a portion other than the expansion part (6a) of the through hole 6 (hereinafter, the portion other than the expansion part (6a) is also referred to as a "main body part (6b)"). The expansion part (6a) is in contact with the first conductor pattern. The expansion part (6a) is a portion that widens the opening width of the through hole 6 toward the first conductor pattern side in any range that continues to an end part on the first conductor pattern side in an axial direction of the through hole 6, that is, in a thickness direction of the wiring substrate 100 (hereinafter, this direction is also referred to as the "Z direction"). The expansion part (6a) is also said to be a portion added to a side peripheral surface of a through hole 6 that does not have an expansion part (6a) (that is, to a side peripheral surface of the main body part (6b)) at a portion adjacent to the first conductor pattern. The expansion part (6a) is preferably added all around the side peripheral surface of the main body part (6b). The expansion part (6a) is also a portion that causes the through hole 6 to widen toward the first conductor pattern. The "opening width" of the through hole 6 is a longest distance between any two points on an outer periphery of the through hole 6 in a plan view. The term "plan view" means viewing the wiring substrate of the embodiment along the Z direction.

As illustrated in FIG. 2, the through hole 6 penetrating the insulating layer 22 has the expansion part (6a) that widens the opening width on the side of the conductor pattern 111 (the first conductor pattern with respect to the plating conductor 42). Referring to FIG. 1 again, each of the through holes 6 penetrating the insulating layer 21 has an expansion part that widens the opening width on the side of the conductor patterns 115, which are the first conductor pattern with respect to the plating conductors 41, and, similarly, each of the through holes 6 penetrating the insulating layer 23 has an expansion part that widens the opening width on the side of the conductor patterns 116, and each of the through holes 6 penetrating the insulating layer 24 has an expansion part that widens the opening width on the side of the conductor patterns 113.

Since each of the through holes 6 has the expansion part (6a), each of the plating conductors (41-44) is widened in the expansion part (6a). That is, each of the plating conductors (41-44) also has an expansion part in the expansion part (6a) of each of the through holes 6. Therefore, contact areas between the plating conductors (41-44) and the conductor patterns (115, 111, 116, 113) are increased compared to a case where the expansion part (6a) is not provided. In other words, the contact areas between the plating conductors (41-44) and the first conductor patterns with respect to the plating conductors are increased compared to the case where the expansion part (6a) is not provided. Therefore, adhesion strength between each of the plating conductors (41-44) connecting two conductor layers facing each other and the first conductor pattern with respect to the each plating conductor is improved. Therefore, it is thought that connection reliability between each of the plating conductors and the first conductor pattern with respect to the each of the plating conductors is high. It is thought that a wiring substrate having high connection reliability between conductor layers is obtained.

With reference to FIGS. 2 and 3, the expansion part (6a) is further described. In the following description with reference to FIGS. 2 and 3, the conductor pattern 111 is also referred to as a first conductor pattern 111, and the conductor pattern 112 is also referred to as a second conductor pattern 112. Description about the first conductor pattern 111 also applies to the conductor patterns (115, 116, 113) in FIG. 1, which can be first conductor patterns, and description about the second conductor pattern 112 also applies to the conductor patterns (111, 113, 114) in FIG. 1, which can be second conductor patterns. Further, description about the plating conductor 42 also applies to the plating conductors (41, 43, 44) in FIG. 1, and description about the insulating layer 22 also applies to the insulating layers (21, 23, 24) in FIG. 1.

The expansion part (6a) is formed on the first conductor pattern 111 side of the through hole 6 in the Z direction. In the example of FIG. 2, the expansion part (6a) is formed in a region within 30% of a distance (D1) between the first conductor pattern 111 and the second conductor pattern 112 from the first conductor pattern 111 in a thickness direction of the insulating layer 22. The expansion part (6a) is not limited to the example of FIG. 2, and may be formed in a region within 50% of the distance (D1) from the first conductor pattern 111.

An opening width (L1) (a maximum length of the expansion part (6a) in the Z direction) (see FIG. 3) of the expansion part (6a), which opens along an inner wall of the main body part (6b), is, for example, 15% or more and 50% or less, preferably 20% or more and 30% or less, of the distance (D1). It is thought that the expansion part (6a) is easily formed in the through hole 6 and the expansion part (6a) is easily filled with the first plating film (4a) and the second plating film (4b). Therefore, it is thought that the plating conductor 42 is unlikely to contain an unfilled portion such as a void.

In the example of FIG. 2, the through hole 6 as a whole has a shape that tapers from the second conductor pattern 112 side toward the first conductor pattern 111 side. Specifically, a portion of the through hole 6 on the second conductor pattern 112 side of the expansion part (6a) has a shape (tapered shape) that tapers from the second conductor pattern 112 side toward the first conductor pattern 111 side. Therefore, in a portion of the plating conductor 42 on the second conductor pattern 112 side of the expansion part (6a), a width on the first conductor pattern 111 side is smaller than a width on the second conductor pattern 112 side. However, in the present embodiment, the through hole 6 has the expansion part (6a) and the plating conductor 42 also has its own expansion part in the expansion part (6a). Therefore, as described above, adhesion between the plating conductor 42 and the first conductor pattern 111 is improved compared to the case where the expansion part (6a) is not provided. Therefore, it is thought that good connection reliability between the plating conductor 42 and the first conductor pattern 111 is obtained.

A length (E1) (a length of the expansion part (6a) in a direction perpendicular to the Z direction) (see FIG. 3) by which the opening width of the through hole 6 is increased by the expansion part (6a) is, for example, 5 μm or more and 15 μm or less. Further, an opening width (W1) of the through hole 6 including the expansion part (6a) at an interface with the first conductor pattern 111 is, for example, 90% or more and 120% or less of an opening width (W2) of the through hole 6 at an interface with the second conductor pattern 112. It is thought that an increase in contact area that results in an improvement in adhesion strength between the plating conductor 42 and the first conductor pattern 111 is obtained, and an unfilled portion is unlikely to occur in the expansion part (6a). The opening width (W2) of the through hole 6 is, for example, 45 μm or more and 60 μm or less.

As illustrated in FIG. 2, a surface (11a) of the first conductor pattern 111 on the second conductor pattern 112 side is curved at a contact part with the plating conductor 42. The surface (11a) is curved toward a direction opposite to the plating conductor 42 and recessed toward the direction opposite to the plating conductor 42 at the contact part with the plating conductor 42. Therefore, the contact area between the plating conductor 42 and the first conductor pattern 111 is increased compared to when the surface (11a) is not curved. Therefore, it is thought that the adhesion strength between the plating conductor 42 and the first conductor pattern 111 is higher than when the surface (11a) is not curved. As described above, the first plating film (4a) of the plating conductor 42 is directly formed on the inner wall of the through hole 6 and functions as a power feeding layer when the second plating film (4b) is formed. As illustrated in FIG. 3, a thickness of the first plating film (4a) varies depending on, for example, unevenness of an inner wall surface of the through hole 6 and presence or absence of the filler particles 7 near the inner wall surface. However, in the present embodiment, the first plating film (4a) does not have an extremely thin portion even in the expansion part (6a) of the through hole 6, and has a thickness in the entire expansion part (6a) that allows the first plating film (4a) to properly function as a power feeding layer. Therefore, in the present embodiment, a minimum thickness (T1) of the first plating film (4a) in the expansion part (6a) is 55% or more and 95% or less of a minimum thickness (T2) of the first plating film (4a) in the through hole 6 in the portion (main body part (6b)) other than the expansion part (6a). The thickness of the first plating film (4a) in the expansion part (6a) or in the main body part (6b) is a distance between an interface between the first plating film (4a) and the inner wall of the through hole 6 and an interface between the first plating film (4a) and the second plating film (4b), that is, a distance between the inner wall of through hole 6 and the second plating film (4b).

A plating film, such as the first plating film (4a), formed on an inner wall surface of a recess such as the expansion part (6a) that is recessed further from an inner wall surface of a through hole in an insulating layer may have a large variation in film thickness. When the film thickness of the first plating film (4a), which can be a power feeding layer when the second plating film (4b) is formed, varies greatly in the expansion part (6a), it may be possible that the second plating film (4b) is not sufficiently deposited in the expansion part (6a) and/or in the main body part (6b). In particular, when there is a portion where the first plating film (4a) is not deposited or the first plating film (4a) has an extremely thin portion, it may be possible that the second plating film (4b) is not deposited on those portions or there is a noticeable difference in deposition rate of the second plating film (4b) between those portions and the other portions. In that case, it may be possible that an unfilled portion such as a void that is not filled with the plating conductor 42 is formed in the expansion part (6a) and/or in the main body part (6b). When subjected to a change in ambient temperature, such an unfilled portion may cause a crack in the plating conductor 42 or may reduce conductivity of the plating conductor 42.

However, in the present embodiment, even in the expansion part (6a), the first plating film (4a) has a thickness of at least 55% or more of the minimum thickness (T2) in the main body part (6b). Therefore, even in the expansion part (6a), the second plating film (4b) is likely to be properly deposited, and the expansion part (6a) and the main body part (6b) are likely to be properly filled with the plating conductor 42. That is, an unfilled portion such as a void is unlikely to be formed in the through hole 6. Therefore, a crack or a reduction in conductivity is unlikely to occur in the plating conductor 42. Further, in the expansion part (6a), the first plating film (4a) has a minimum thickness (T1) of 95% or less of the minimum thickness (T2) in the main body part (6b). Therefore, in forming the first plating film (4a), a plating treatment under an excessive condition regarding a plating time or the like is avoided. Therefore, it is thought that a wiring substrate is provided that has excellent physical and electrical connection reliability between conductor layers facing each other and that is produced without a significant decrease in productivity.

As illustrated in FIG. 3, the first plating film (4a) is deposited on the inner wall of the through hole 6 in the expansion part (6a). In the example of FIG. 3, in the expansion part (6a), a part of the first plating film (4a) is further deposited between some (filler particles 71) of the multiple granular filler particles 7 and the insulating resin 20, which form the insulating layer 22. That is, by a plating treatment in which the first plating film (4a) is deposited to an appropriate thickness on the inner wall of the expansion part (6a), the first plating film (4a) is also deposited between the filler particles 71, which are some of the multiple filler particles 7, and the insulating resin 20. As a result, the first plating film (4a) also covers around the filler particles 71. The first plating film (4a) on the inner wall of the expansion part (6a) and the first plating film (4a) covering around the filler particles 71 in the expansion part (6a) are integrally formed. The filler particles 71 covered around by the first plating film (4a) in the expansion part (6a) are, for example, filler particles exposed on the inner wall surface of the expansion part (6a). The filler particles 71 covered around by the first plating film (4*a*) in the expansion part 6*a* may be filler particles connected to the inner wall surface of the expansion part 6*a* by other filler particles among the multiple filler particles 7. In the example of FIG. 3, also in the main body part (6*b*) of the through hole 6, the first plating film (4*a*) is deposited on the inner wall of the main body part (6*b*) and between some of the multiple filler particles 7 and the insulating resin 20.

In the example of FIG. 3, in this way, not only in the main body part (6*b*) but also in the expansion part (6*a*), the first plating film (4*a*) is deposited between the some filler particles 71 and the insulating resin 20 and covers around the some filler particles 71. Therefore, it is thought that adhesion strength between the first plating film (4*a*) and the insulating layer 22 is high and peeling between the two is unlikely to occur.

As in the example of FIG. 3, the insulating layer 22 may contain the filler particles 71 covered around by the first plating film (4*a*). The multiple filler particles 7 may have substantially uniform particle sizes, or the multiple filler particles 7 may have mutually different particle sizes. The particle sizes of the multiple filler particles 7 are, for example, 0.1 µm or more and 1 µm or less. The insulating layer 22 may contain, as some of the multiple filler particles 7, the filler particles 71 that have particle sizes of 0.5 µm or more and 1 µm or less and are positioned along an interface with the expansion part (6*a*) of the through hole 6 and are covered around by the first plating film (4*a*). When the relatively large filler particles 71 are covered by the first plating film (4*a*), it may be possible that the adhesion strength between the first plating film (4*a*) and the insulating layer 22 is further enhanced.

Figure 4A:
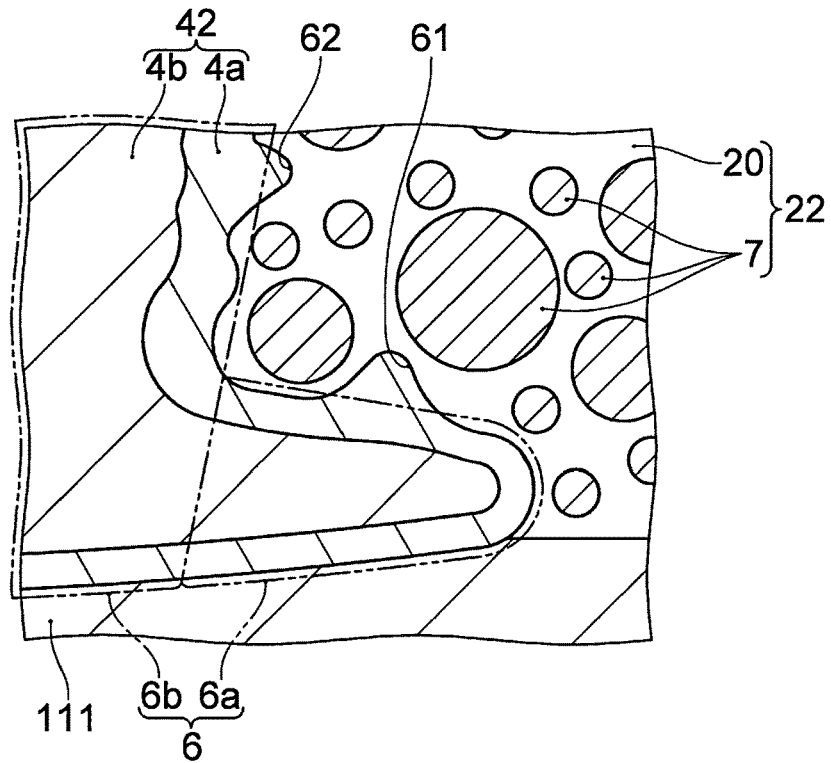
FIG. 4A is a cross-sectional view illustrating another example of a plating conductor in a wiring substrate according to an embodiment of the present invention.
Figure 4B:
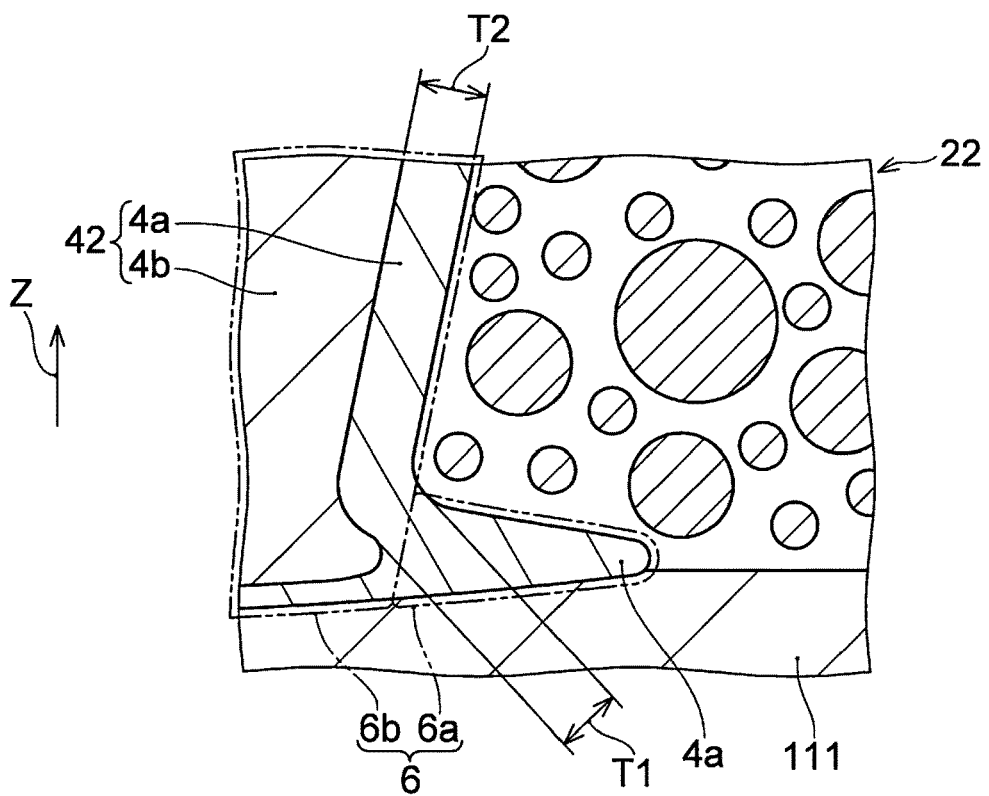
FIG. 4B is a cross-sectional view illustrating yet another example of a plating conductor in a wiring substrate according to an embodiment of the present invention.

FIGS. 4A and 4B illustrate other examples of the wiring substrate of the present embodiment. FIGS. 4A and 4B illustrate a portion corresponding to FIG. 3 in the other examples. In FIGS. 4A and 4B, a structural element that is the same as a structural element illustrated in FIG. 3 is indicated using the same reference numeral symbol as the one used in FIG. 3, and repetitive description of the structural element is omitted.

In the example of FIG. 4A, the inner wall surface of the through hole 6 penetrating the insulating layer 22 includes a recess 61 and a recess 62, which face toward an inner side of the insulating layer 22. The recess 61 exists on the inner wall surface in the expansion part (6*a*) and the recess 62 exists on the inner wall surface in the main body part (6*b*). The recesses (61, 62) are formed, for example, by detachment of the filler particles 7 exposed on the inner wall surface of the through hole 6. Since the first plating film (4*a*) is formed on the inner wall of the through hole 6, the recess 61 and the recess 62 are filled with the first plating film (4*a*).

In the wiring substrate of the embodiment, since the first plating film (4*a*) having an appropriate thickness is formed on the inner wall of the expansion part (6*a*), not only the recess 62 existing in the main body part (6*b*) but also the recess 61 existing in the expansion part (6*a*) is filled with the first plating film (4*a*). That is, by the plating treatment in which the first plating film (4*a*) is deposited to an appropriate thickness on the inner wall of the expansion part (6*a*), the recess 61 in the expansion part (6*a*) is filled with the first plating film (4*a*). When the recess 61 is filled with the first plating film (4*a*), since the contact area between the first plating film (4*a*) and the inner wall of the through hole 6 is increased, it is thought that the adhesion strength between the insulating layer 22 and the first plating film (4*a*) is improved. In the present embodiment, the recess 61 having a depth of 0.3 µm or more and 0.5 µm or less existing on the inner wall of the through hole 6 in the expansion part (6*a*) may be filled with the first plating film (4*a*). It is thought that peeling between the insulating layer 22 and the first plating film (4*a*) in the expansion part (6*a*) is unlikely to occur and a plating treatment taking an excessive amount of time in forming the first plating film (4*a*) is avoided.

In the example of FIG. 4B, similar to the examples of FIGS. 3 and 4A, the through hole 6 has the expansion part (6*a*). However, in the example of FIG. 4B, the expansion part (6*a*) is entirely filled with the first plating film (4*a*). For example, when the length of the expansion part (6*a*) in the direction perpendicular to the Z direction is relatively short and an inner diameter of the expansion part (6*a*) in the Z direction is relatively small, as in the example of FIG. 4B, the expansion part (6*a*) is substantially entirely filled with the first plating film (4*a*) only. In this way, in the present embodiment, the expansion part (6*a*) may be entirely filled with the first plating film (4*a*) only. Also in the example of FIG. 4B, the minimum thickness (T1) of the first plating film (4*a*) (the distance between the second plating film (4*b*) and the inner wall of the through hole 6) in the expansion part (6*a*) is 55% or more and 95% or less of the minimum thickness (T2) of the first plating film (4*a*) in the main body part (6*b*).

Figure 5:
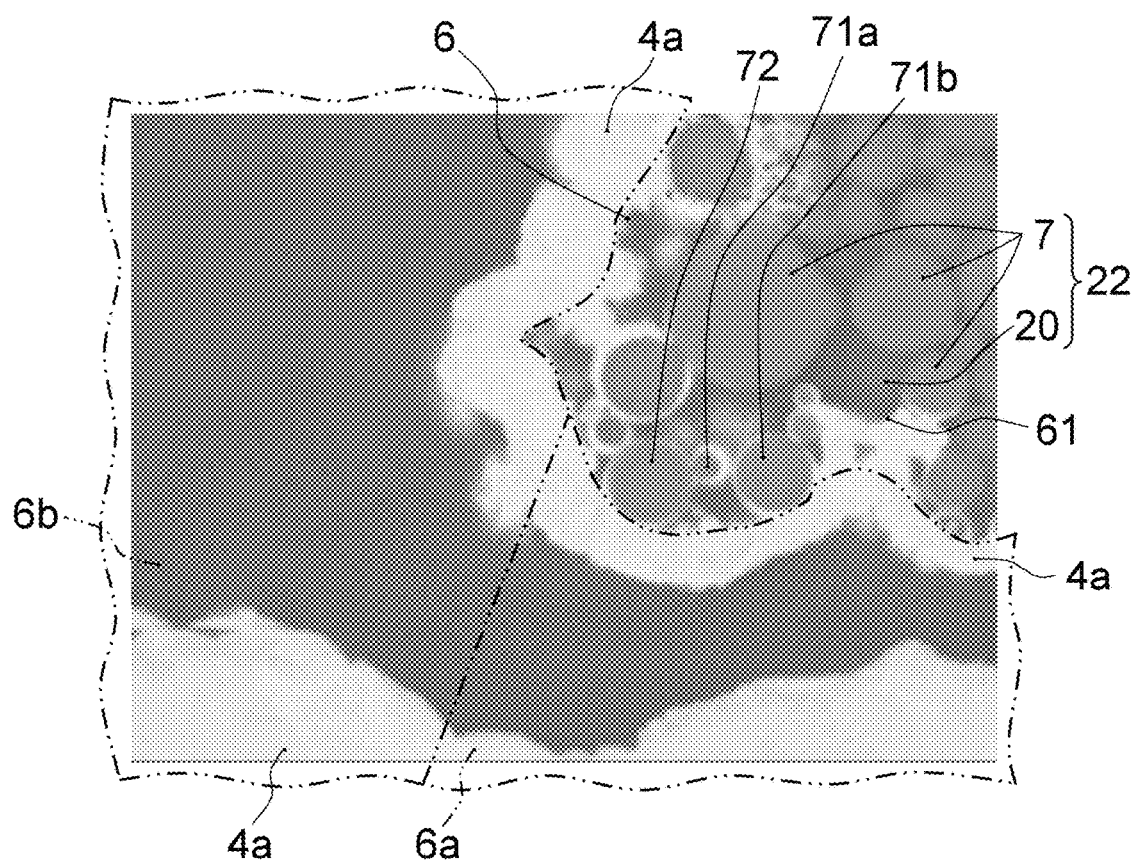
FIG. 5 is an SEM image of a cross section near an expansion part of a through hole in a working example according to an embodiment of the present invention.

FIG. 5 shows an SEM image of a cross section near a part of the main body part (6*b*) of the through hole 6 and the expansion part (6*a*) in a working example of the wiring substrate of the embodiment. FIG. 5 shows a state of a portion near a part of the main body part (6*b*) and the expansion part (6*a*) before the second plating film (4*b*) (see FIG. 3) is formed. The first plating film (4*a*) is formed on the inner wall of the through hole 6 penetrating the insulating layer 22. The first plating film (4*a*) is also formed on the inner wall of the expansion part (6*a*). The insulating layer 22 contains the insulating resin 20 and the multiple filler particles 7 added to the insulating resin 20. As shown in FIG. 5, it is seen that, in the working example, in the expansion part (6*a*), a part of the first plating film (4*a*) is also deposited between filler particles (71*a*, 71*b*), which are some of the multiple filler particles 7, and the insulating resin 20. Further, it is seen that a recess 61 existing on the inner wall of the expansion part (6*a*) is filled with the first plating film (4*a*). The filler particles (71*b*) are exposed on the inner wall surface of the expansion part (6*a*). On the other hand, the filler particles (71*a*) are connected to the inner wall surface of the expansion part (6*a*) via other filler particles 72.

Next, a method for manufacturing the wiring substrate of the embodiment is described with reference to FIGS. 6A-6G, using the wiring substrate 100 of FIG. 1 as an example.

Figure 6A:
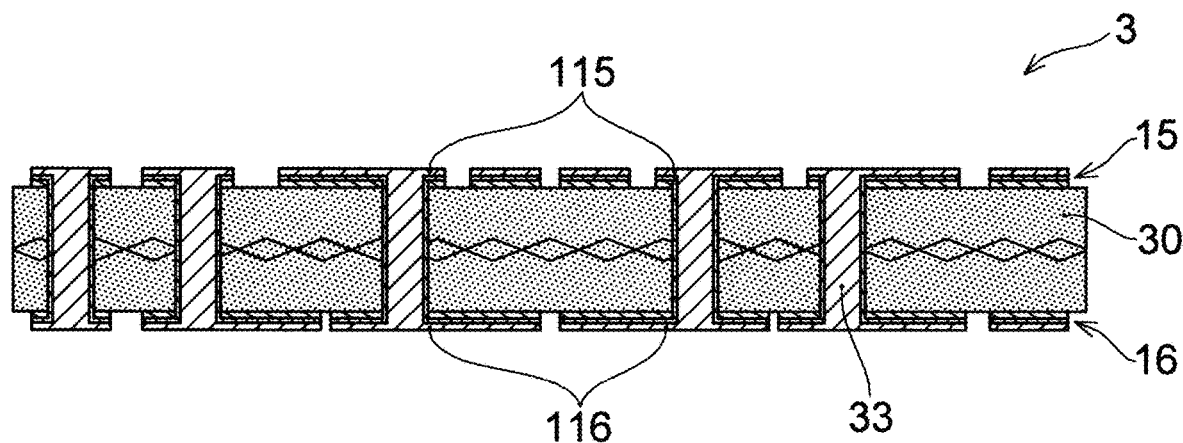
FIG. 6A is a cross-sectional view illustrating an example of a state of ae wiring substrate according to an embodiment of the present invention during a manufacturing process.

As illustrated in FIG. 6A, the core substrate 3 is formed. For example, the conductor layer 15 and the conductor layer 16, which respectively have the conductor patterns 115 and the conductor patterns 116, and the through-hole conductors 33 are formed using a subtractive method on or in a double-sided copper-clad laminated substrate including an insulating layer that is to become the insulating layer 30 of the core substrate 3.

Figure 6B:
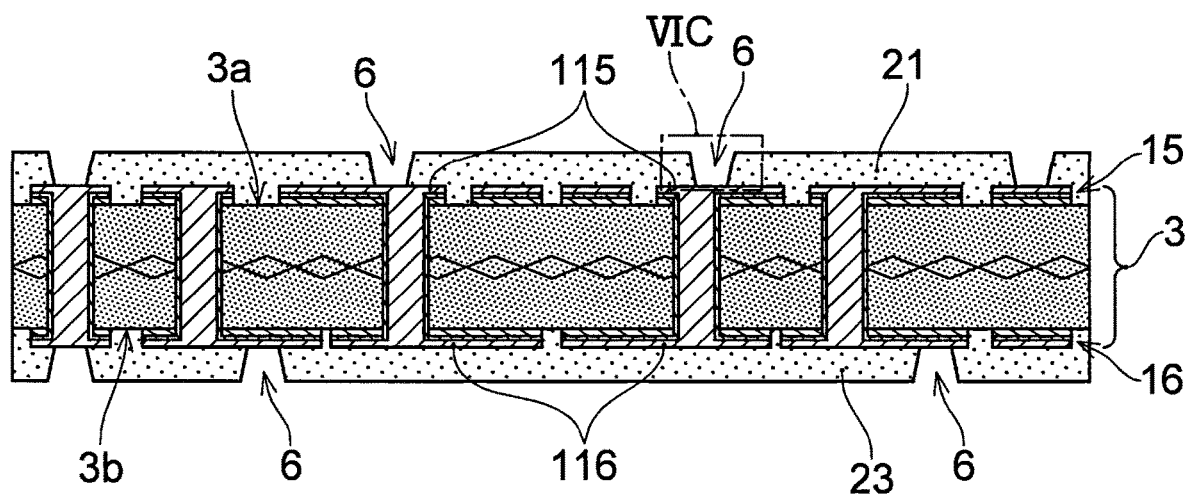
FIG. 6B is a cross-sectional view illustrating an example of a state of a wiring substrate according to an embodiment of the present invention during a manufacturing process.

As illustrated in FIG. 6B, the insulating layer 21 and the insulating layer 23 are respectively formed on the first surface (3*a*) and the second surface (3*b*) of the core substrate 3. For example, the insulating layer 21 and the insulating layer 23 are formed by laminating a film-like epoxy resin on both sides of the core substrate 3 and applying heat and pressure thereto.

The through holes 6 are formed in the insulating layer 21 and the insulating layer 23, for example, by irradiating $CO_2$ laser. The through holes 6 are formed at positions where the plating conductors (41, 43) (see FIG. 6F) are to be formed. In the example of FIG. 6B, the through holes 6 each having a shape that tapers toward the core substrate 3 are formed, for example, by adjusting an irradiation condition of the CO2 laser.

Figure 6C:
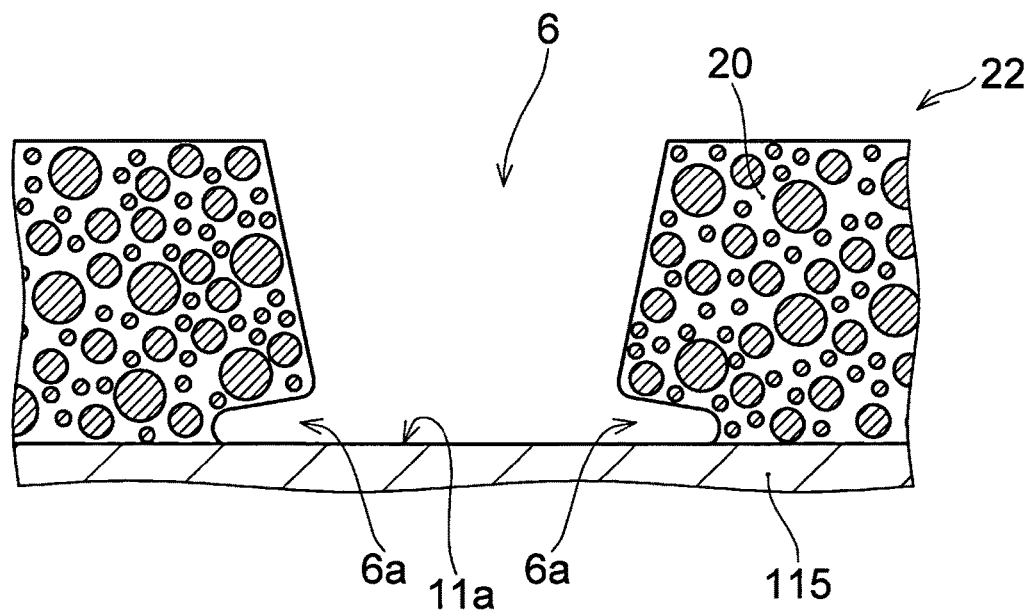
FIG. 6C is a cross-sectional view illustrating an example of a state of a wiring substrate according to an embodiment of the present invention during a manufacturing process.

As illustrated in FIG. 6C, near an interface between a through hole 6 and a conductor pattern 115 of the conductor layer 15 (see FIG. 6B), the expansion part (6*a*) of the through hole 6 is formed. In FIG. 6C (and FIGS. 6D and 6E to be referenced later), an enlarged view of a state of a portion corresponding to a portion (VIC) in FIG. 6B in a respective process is illustrated. Although not illustrated in FIGS. 6C-6E, the processing or treatment executed with respect to the conductor patterns 115 and the insulating layer 21 in FIGS. 6C-6E is also executed with respect to the conductor patterns 116 of the conductor layer 16 and the insulating layer 23 illustrated in FIG. 6B.

The expansion part (6*a*) is formed, for example, by a desmear treatment in which resin residues (smears) remaining in the through hole 6 after the formation of the through hole 6 are removed. In the desmear treatment, the smears in the through hole 6 are removed by exposing the inner wall of the through hole 6 to a processing liquid such as an alkaline permanganate solution. By causing the processing liquid for the desmear treatment to moderately penetrate into an interface between the conductor pattern 115 and the insulating layer 21, a portion of the insulating resin 20 of the insulating layer 22 in contact with the conductor pattern 115 is dissolved. In this way, by causing a part of the insulating resin 20 in contact with the conductor pattern 115 to dissolve, the expansion part (6*a*) is formed. The expansion part (6*a*) may also be formed by appropriately adjusting an irradiation condition of the laser used for forming the through hole 6, such as power or irradiation time of the laser. After that, when the wiring substrate 100 of the example of FIG. 1 is manufactured, a soft etching process is performed prior to the formation of the plating conductors 41 in a subsequent process (see FIG. 6F). By the soft etching process, an oxide film or the like covering the surface (11*a*) of the conductor pattern 115 on the through hole 6 side is removed. A state of the conductor pattern 115 after the soft etching is illustrated in FIG. 6D.

Figure 6D:
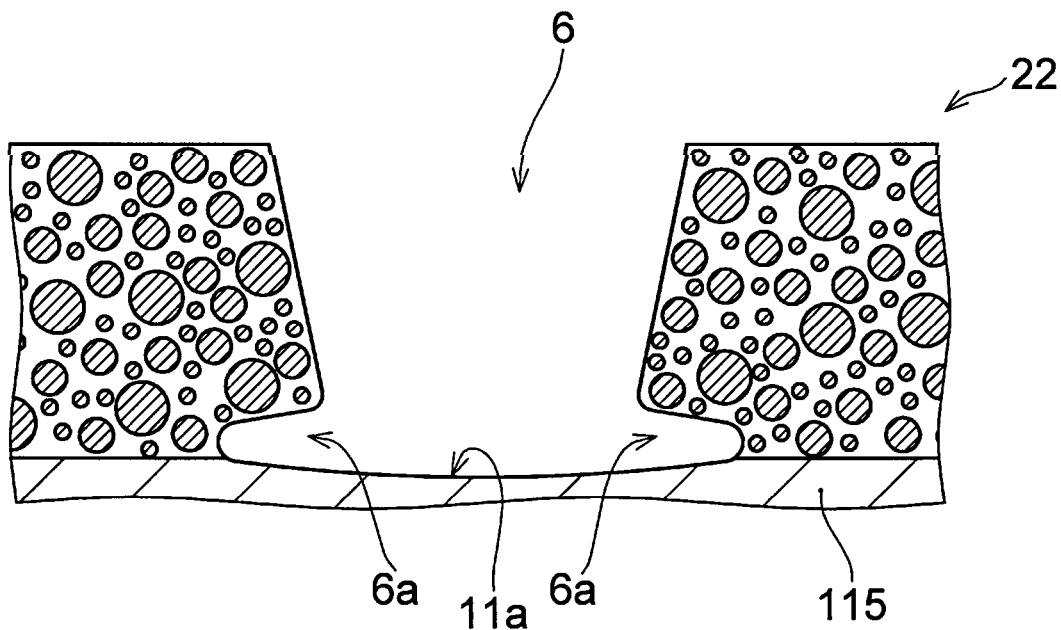
FIG. 6D is a cross-sectional view illustrating an example of a state of a wiring substrate according to an embodiment of the present invention during a manufacturing process.

As illustrated in FIG. 6D, by the soft etching, an exposed portion of the surface (11*a*) of the conductor pattern 115 is slightly removed, and as a result, the exposed portion of the surface (11*a*) is recessed toward the opposite direction with respect to the through holes 6. By recessing the exposed portion of the surface (11*a*), it may be possible that, in the formation of the first plating film (4*a*) in a subsequent process (see FIG. 6E), various processing liquids easily enter into the expansion part (6*a*), which facilitates the formation of the first plating film (4*a*).

Figure 6E:
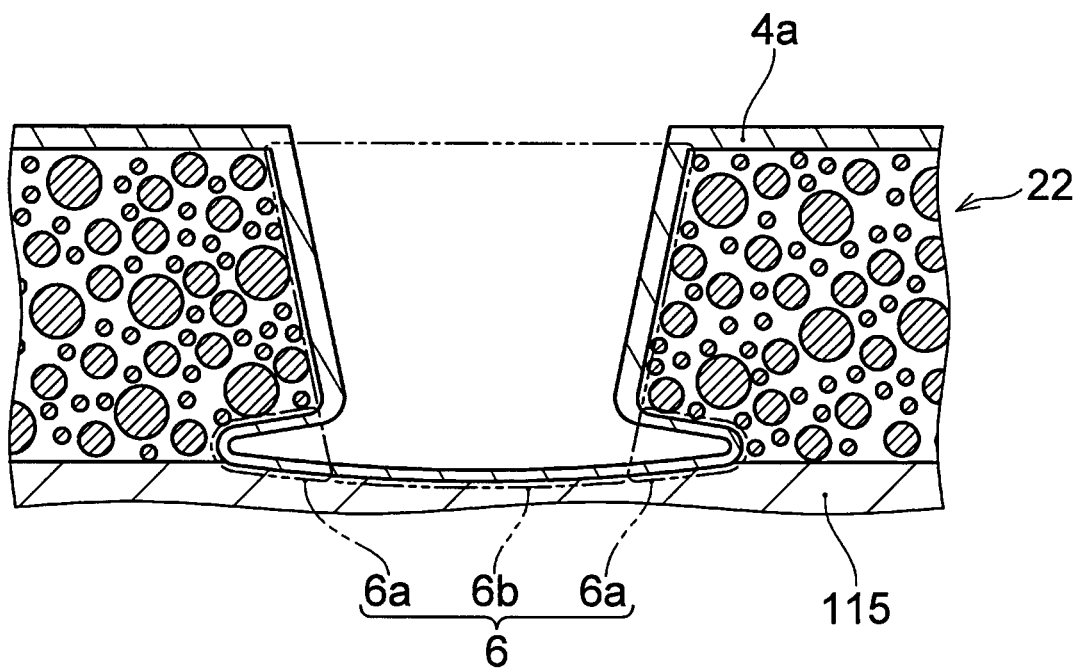
FIG. 6E is a cross-sectional view illustrating an example of a state of a wiring substrate according to an embodiment of the present invention during a manufacturing process.

As illustrated in FIG. 6E, the first plating film (4*a*) is formed on the surface of the insulating layer 22 and on the inner wall of the through hole 6. The first plating film (4*a*) is formed such that the thickness of the first plating film (4*a*) in the expansion part (6*a*) is at least 55% of the minimum thickness of the first plating film (4*a*) in the main body part (6*b*), which is a portion of the through hole 6 other than the expansion part (6*a*). A method of forming the first plating film (4*a*) is not particularly limited. However, preferably, the first plating film (4*a*) is formed by electroless plating. By using an electroless plating method, the first plating film (4*a*) that does not include a significantly thin portion compared to the thickness in the main body part (6*b*) is relatively easily formed in the expansion part (6*a*). For example, by bubbling air bubbles into an electroless plating bath, circulation in the plating bath is promoted, which facilitates entry of a fresh plating solution having an appropriate ion concentration into the expansion part (6*a*) on a steady basis.

In this way, also in the formation of the first plating film (4*a*) that does not have a significantly thin portion even in the expansion part (6*a*), in order to avoid a significant decrease in productivity, conditions of the plating treatment, such as a plating treatment time and a temperature of the plating bath, are adjusted. As a result, the first plating film (4*a*) having a minimum thickness of 95% or less of the minimum thickness in the main body part (6*b*) is formed in the expansion part (6*a*).

Figure 6F:
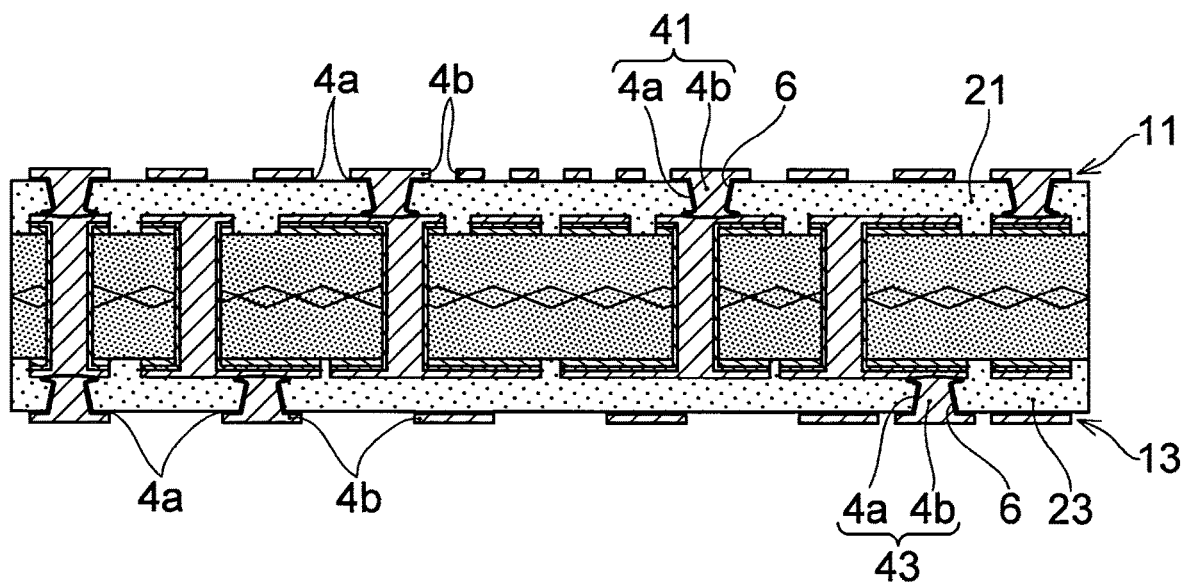
FIG. 6F is a cross-sectional view illustrating an example of a state of a wiring substrate according to an embodiment of the present invention during a manufacturing process.

As illustrated in FIG. 6F, the conductor layer 11 and the conductor layer 13 each including the first plating film (4*a*) and the second plating film (4*b*) are formed. The plating conductors 41 are formed in the through holes 6 penetrating the insulating layer 21, and the plating conductors 43 are formed in the through holes 6 penetrating the insulating layer 23. The plating conductors 41 and the plating conductors 43 each including the first plating film (4*a*) and the second plating film (4*b*) are formed. The conductor layer 11 and the conductor layer 13, and the plating conductors 41 and the plating conductors 43, are formed, for example, using a semi-additive method. That is, a plating resist (not illustrated in the drawings) having appropriate openings is provided on the first plating film (4*a*), and the second plating film (4*b*) is formed in the openings of the plating resist by electrolytic plating. After the formation of the second plating film (4*b*), the plating resist (not illustrated in the drawings) is removed. After that, a portion of the first plating film (4*a*) that is not covered by the second plating film (4*b*) is removed, for example, by short-time etching such as flash etching. As a result, the conductor layer 11 and the conductor layer 13, each including predetermined conductor patterns, are formed. In the through holes 6, the plating conductors 41 and the plating conductors 43 are formed as via conductors connecting the conductor layers.

Figure 6G:
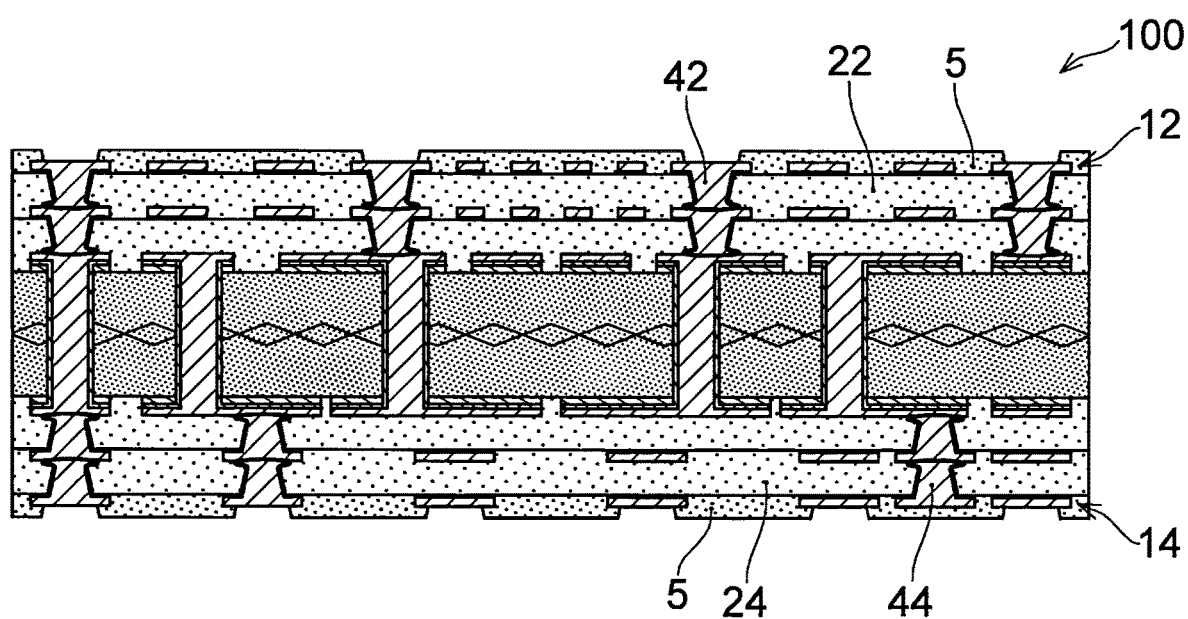
FIG. 6G is a cross-sectional view illustrating an example of a state of a wiring substrate according to an embodiment of the present invention during a manufacturing process.

As illustrated in FIG. 6G, further, the insulating layer 22 and the insulating layer 24 are formed. Further, the conductor layer 12 and the conductor layer 14 are formed, and the plating conductors 42 penetrating the insulating layer 22 and the plating conductors 44 penetrating the insulating layer 24 are formed. The insulating layer 22 and the insulating layer 24 may be formed using the same method as the method for forming the insulating layer 21 described above, and the plating conductors 42 and the plating conductors 44 may be formed using the same method as the method for forming the plating conductors 41 described above. Further, the conductor layer 12 and the conductor layer 14 may be formed using the same method as the method for forming the conductor layer 11 described above.

In the example of FIG. 6G in which the wiring substrate 100 is manufactured, each of the solder resists 5 is formed, for example, by supplying a photosensitive epoxy resin or a photosensitive polyimide resin or the like to a surface of the wiring substrate 100 during processing by spraying, lamination, printing, or the like. Openings are formed in each of the solder resists 5, for example, by exposure and development using a mask having appropriate opening patterns. Through the above processes, the wiring substrate 100 in the example of FIG. 1 is completed.

The wiring substrate of the embodiment is not limited to those having the structures illustrated in the drawings and those having the structures, shapes, and materials exemplified herein. As described above, the wiring substrate of the embodiment may have any laminated structure. A wiring substrate according to an embodiment may include any number of conductor layers and any number of insulating layers. For example, the wiring substrate of the embodiment may be a so-called coreless substrate that does include a core substrate. In the wiring substrate of the embodiment, one of any pair of conductor patterns facing each other via an insulating layer may be a first conductor pattern and the other may be a second conductor pattern. Further, it is not always necessary for a surface of a first conductor pattern facing a second conductor pattern to be curved toward the opposite direction with respect to the second conductor pattern.

Japanese Patent Application Laid-Open Publication No. 2015-97252 describes a multilayer wiring substrate having an interlayer connection between an inner-layer wiring and an upper-layer wiring. The interlayer connection is formed by filling an interlayer connection hole penetrating an insulating layer with an electrolytically filled plating layer. The interlayer connection hole tapers toward the inner-layer wiring side.

In the multilayer wiring substrate described in Japanese Patent Application Laid-Open Publication No. 2015-97252, since the interlayer connection hole tapers toward the inner-layer wiring side, it is thought that a contact area between the interlayer connection and the inner-layer wiring is small. Therefore, it may be possible that sufficient connection reliability is obtained.

A wiring substrate according to an embodiment of the present invention includes: a first conductor pattern and a second conductor pattern that face each other; a plating conductor that is integrally formed with the second conductor pattern and is in contact with the first conductor pattern; and an insulating layer that has a through hole filled with the plating conductor and is interposed between the first conductor pattern and the second conductor pattern. The through hole has an expansion part that widens an opening width of the through hole on the first conductor pattern side. The plating conductor includes a first plating film directly formed on an inner wall of the through hole and a second plating film formed on the first plating film. A minimum thickness of the first plating film in the expansion part is 55% or more and 95% or less of a minimum thickness of the first plating film in the through hole in a portion other than the expansion part.

According to an embodiment of the present invention, it is thought that a wiring substrate is provided having high connection reliability between a plating conductor, which connects conductor patterns to each other, and a conductor pattern.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a first conductor pattern;
a second conductor pattern facing the first conductor pattern;
an insulating layer interposed between the first conductor pattern and the second conductor pattern and having a through hole; and
a plating conductor integrally formed with the second conductor pattern and filling the through hole formed in the insulating layer such that the plating conductor is in contact with the first conductor pattern,
wherein the through hole has an expansion part such that an opening width of the through hole on a first conductor pattern side is widened, and the plating conductor includes a first plating film directly formed on an inner wall of the through hole and a second plating film formed on the first plating film such that a minimum thickness of the first plating film in the expansion part is in a range of 55% to 95% of a minimum thickness of the first plating film in the through hole other than the expansion part.

2. The wiring substrate according to claim 1, wherein the insulating layer includes an insulating resin and filler particles to the insulating resin, and the first plating film includes part in the expansion part formed such that the part is deposited between a portion of the filler particles and the insulating resin.

3. The wiring substrate according to claim 2, wherein the insulating layer includes the filler particles such that the portion of the filler particles has particle sizes in a range of 0.5 μm to 1 μm and is covering around by the first plating film along an interface with the expansion part.

4. The wiring substrate according to claim 1, wherein a width on the first conductor pattern side is smaller than a width on a second conductor pattern side in a portion of the plating conductor on the second conductor pattern side of the expansion part.

5. The wiring substrate according to claim 1, wherein the through hole in the insulating layer is formed such that the inner wall of the through hole has a recess having a depth in a range of 0.3 μm to 0.5 μm and filled with the first plating film.

6. The wiring substrate according to claim 1, wherein the through hole in the insulating layer is formed such that the expansion part is entirely filled with the first plating film of the plating conductor.

7. The wiring substrate according to claim 2, wherein a width on the first conductor pattern side is smaller than a width on a second conductor pattern side in a portion of the plating conductor on the second conductor pattern side of the expansion part.

8. The wiring substrate according to claim 2, wherein the through hole in the insulating layer is formed such that the inner wall of the through hole has a recess having a depth in a range of 0.3 μm to 0.5 μm and filled with the first plating film.

9. The wiring substrate according to claim 2, wherein the through hole in the insulating layer is formed such that the expansion part is entirely filled with the first plating film of the plating conductor.

10. The wiring substrate according to claim 3, wherein a width on the first conductor pattern side is smaller than a width on a second conductor pattern side in a portion of the plating conductor on the second conductor pattern side of the expansion part.

11. The wiring substrate according to claim 3, wherein the through hole in the insulating layer is formed such that the inner wall of the through hole has a recess having a depth in a range of 0.3 μm to 0.5 μm and filled with the first plating film.

12. The wiring substrate according to claim 3, wherein the through hole in the insulating layer is formed such that the expansion part is entirely filled with the first plating film of the plating conductor.

13. The wiring substrate according to claim 4, wherein the through hole in the insulating layer is formed such that the inner wall of the through hole has a recess having a depth in a range of 0.3 μm to 0.5 μm and filled with the first plating film.

14. The wiring substrate according to claim 4, wherein the through hole in the insulating layer is formed such that the expansion part is entirely filled with the first plating film of the plating conductor.

15. The wiring substrate according to claim 5, wherein the through hole in the insulating layer is formed such that the expansion part is entirely filled with the first plating film of the plating conductor.

16. The wiring substrate according to claim 10, wherein the through hole in the insulating layer is formed such that the inner wall of the through hole has a recess having a depth in a range of 0.3 μm to 0.5 μm and filled with the first plating film.

17. The wiring substrate according to claim 10, wherein the through hole in the insulating layer is formed such that the expansion part is entirely filled with the first plating film of the plating conductor.

18. The wiring substrate according to claim 16, wherein the through hole in the insulating layer is formed such that the expansion part is entirely filled with the first plating film of the plating conductor.

19. The wiring substrate according to claim 1, wherein the insulating layer includes an insulating resin and filler particles to the insulating resin.

20. The wiring substrate according to claim 19, wherein a width on the first conductor pattern side is smaller than a width on a second conductor pattern side in a portion of the plating conductor on the second conductor pattern side of the expansion part.

* * * * *